United States Patent
Kikugawa et al.

(10) Patent No.: US 8,641,832 B2
(45) Date of Patent: Feb. 4, 2014

(54) METHOD FOR PRODUCING RARE EARTH METAL-BASED PERMANENT MAGNET

(75) Inventors: Atsushi Kikugawa, Osaka (JP); Shinichiro Sakashita, Osaka (JP)

(73) Assignee: Hitachi Metals, Ltd., Tokyo (JP)

( * ) Notice: Subject to any disclaimer, the term of this patent is extended or adjusted under 35 U.S.C. 154(b) by 613 days.

(21) Appl. No.: 12/295,372

(22) PCT Filed: Mar. 30, 2007

(86) PCT No.: PCT/JP2007/057097
§ 371 (c)(1),
(2), (4) Date: Sep. 8, 2009

(87) PCT Pub. No.: WO2007/114336
PCT Pub. Date: Oct. 11, 2007

(65) Prior Publication Data
US 2010/0006182 A1    Jan. 14, 2010

(30) Foreign Application Priority Data

Mar. 31, 2006 (JP) ................................. 2006-099527

(51) Int. Cl.
*C22F 1/16* (2006.01)
*H01F 1/053* (2006.01)

(52) U.S. Cl.
USPC ............ 148/101; 148/301; 148/302; 427/250

(58) Field of Classification Search
None
See application file for complete search history.

(56) References Cited

U.S. PATENT DOCUMENTS 6,861,089 B2 * 3/2005 Nishiuchi et al. ............. 427/127
2001/0036508 A1 * 11/2001 Nishiuchi et al. .......... 427/248.1

FOREIGN PATENT DOCUMENTS

| EP | 799900 A1 | * | 10/1997 |
|---|---|---|---|
| JP | 2001-335921 A1 | | 12/2001 |
| JP | 2003-59741 A1 | | 2/2003 |
| JP | 2003-100537 A1 | | 4/2003 |
| JP | 2003100537 A | * | 4/2003 |
| JP | 2005-105311 | * | 4/2005 |
| JP | 2005-191276 A1 | | 7/2005 |

OTHER PUBLICATIONS

Machine Translation of JP 2005-191276, No Date.*
Machine translation of JP 2003100537 A. Apr. 2003.*
"China Aeronautical Materials Handbook Aluminum Alloy Magnesium Alloy Titanium Alloy," edited by Gongyou Xia, Standards Press of China, 1st Edition, Jul. 31, 1989, pp. 36-38 (with its English translation).
Chinese Office Action dated Sep. 14, 2010 (with its English translation).
International Search Report for International Application No. PCT/JP2007/057097 dated Jun. 28, 2007.

* cited by examiner

*Primary Examiner* — Jie Yang
*Assistant Examiner* — Xiaowei Su
(74) *Attorney, Agent, or Firm* — Kratz, Quintos & Hanson, LLP

(57) ABSTRACT

An objective of the present invention is to provide a method for producing a rare earth metal-based permanent magnet having an Al film containing Mg, which exhibits an excellent salt water resistance. The present invention, which is to accomplish the objective, is a method for producing a rare earth metal-based permanent magnet having formed on the surface thereof an Al film containing Mg by a vapor deposition, characterized in that the production method comprises, in the case of cooling the magnet from a high temperature of 160° C. or higher after the completion of the vapor deposition step inside the treating chamber of a deposition apparatus, rapidly cooling down the magnet at a cooling rate of 10° C./min or higher until the temperature of the magnet reaches at least 60° C.

5 Claims, 2 Drawing Sheets

(a) Al main phase (b) Mg concentration phase

METHOD FOR PRODUCING RARE EARTH METAL-BASED PERMANENT MAGNET

TECHNICAL FIELD

The present invention relates to a method for producing a rare earth metal-based permanent magnet having an excellent salt water resistance. More specifically, it relates to a method for producing a rare earth metal-based permanent magnet having an Al film containing Mg, which exhibits an excellent salt water resistance.

BACKGROUND ART

Rare earth metal-based permanent magnets, for instance, R—Fe—B based permanent magnets represented by a Nd—Fe—B based permanent magnet, or R—Fe—N based permanent magnets represented by a Sm—Fe—N based permanent magnet, etc., utilize inexpensive materials abundant in resources and possess superior magnetic characteristics; particularly among them, the R—Fe—B based permanent magnets are employed today in various fields.

However, since rare earth metal-based permanent magnets contain a highly reactive rare earth metal: R, they are apt to be oxidized and corroded in ambient, and in case they are used without applying any surface treatment, corrosion tends to proceed from the surface in the presence of small acidic or alkaline substance or water to generate rust, and this brings about the degradation and the fluctuation of magnetic characteristics. Moreover, in case such a rusty magnet is embedded in a magnetic circuit and a like device, there is fear of scattering rust as to contaminate peripheral components.

In the light of above-mentioned circumstances, there has been employed a method for forming an Al film by a vapor phase plating method such as a vapor deposition method, on the surface of a rare earth metal-based permanent magnet for the purpose of providing an excellent corrosion resistance to the magnet. Because an Al film not only has an excellent corrosion resistance but also has a superior adhesion reliability with the adhesive which is necessary in embedding the components (delamination hardly occurs between the film and the adhesive up to the intrinsic fracture strength of the adhesive), the Al film is widely applied to rare earth metal-based permanent magnets where high adhesion strength is required, and the rare earth metal-based permanent magnets having an Al film on the surface thereof are utilized by embedding them in various types of motors.

The rare earth metal-based permanent magnets being embedded in automotive motors, which, among various types of motors, may be regarded as magnets used under the severest utilization environments, because they are used under environments with violent temperature change, or they are exposed to chlorine ions contained in antifreezing agents that are spread on roads in cold regions, or they are exposed to salt water in the coastal area. Accordingly, the rare earth metal-based permanent magnets being embedded in automotive motors are required to exhibit an excellent corrosion resistance even in the severest corrosion resistance test, i.e., a salt water spray test. Regretfully, however, Al film is not sufficiently resistant against salt water. As a method for improving a salt water resistance of a rare earth metal-based permanent magnet having an Al film on the surface thereof, there can be mentioned methods such as forming laminates of chemical conversion films (Patent literature 1), or metal oxide films (Patent literature 2) on the surface of the Al film; however, there still are problems such that it makes the production process complicated, or that the salt water resistance is still insufficient.

Patent literature 3 discloses forming a film containing Mg and oxygen on the plated surface of a Al hot-dipping plated steel sheet under open atmosphere, by which a sufficient corrosion resistance is obtained under a salt corrosion environment, and as a method for forming such a film, there is mentioned a method comprising conducting Al hot-dipping by immersing the steel sheet into a bath containing Al and Mg, followed by allowing the dipped steel sheet to stand in ambient atmosphere to effect surface oxidation. However, this method cannot be applied to rare earth metal-based permanent magnets due to the following reasons.

If Al hot-dipping, which is carried out at a temperature of 500° C. or higher, should be applied to magnets, the surface of the magnets reacts with Al and undergoes changing in quality under such a high temperature as to deteriorate the magnetic characteristics.

The changing in quality of the surface of a magnet exerts considerable harmful effects particularly on the magnetic characteristics of compact magnets.

Contact imprints remain on the magnets because hot-dipping basically comprises immersing and drawing out processes.

Accordingly, as a method for imparting a salt water resistance to a rare earth metal-based permanent magnet, one of the present inventors has proposed in patent literature 4 a method comprising vapor depositing an Al film containing 3 mass % to 10 mass % of Mg on the surface of a magnet.

Patent Literature 1: JP-A-2000-150216
Patent Literature 2: JP-A-2000-232011
Patent Literature 3: JP-A-2000-282262
Patent Literature 4: JP-A-2005-191276

DISCLOSURE OF THE INVENTION

Problems the Invention is to Solve

The method above proposed in Patent Literature 4 by one of the present inventors is well known in the art as an excellent method for imparting a salt water resistance to a rare earth metal-based permanent magnet; recently, however, yet improved salt water resistance is required on the rare earth metal-based permanent magnet.

Accordingly, an objective of the present invention is to provide a method for producing a rare earth metal-based permanent magnet having an Al film containing Mg, which exhibits an excellent salt water resistance.

Means for Solving the Problems

In the light of the circumstances above, the present inventors have made extensive studies, and as a result, they have found that, by properly controlling the temperature on cooling the rare earth metal-based permanent magnet after forming an Al film containing Mg on the surface of the magnet inside the treating chamber of a deposition apparatus, the Al film containing Mg formed on the surface of the magnet exhibits an excellent salt water resistance.

One embodiment of the present invention accomplished based on the above findings is a method for producing a rare earth metal-based permanent magnet having formed on the surface thereof an Al film containing Mg by a vapor deposition, characterized in that the production method comprises, in the case of cooling the magnet from a high temperature of 160° C. or higher after the completion of the vapor deposition step inside the treating chamber of a deposition apparatus, rapidly cooling down the magnet at a cooling rate of 10° C/min or higher until the temperature of the magnet reaches at least 60° C.

Further, the production method may be characterized in that the magnet is held for at least 5 minutes at 160° C. or higher prior to the cooling operation.

Moreover, the production method may be characterized in that the rapid cooling is effected by introducing gaseous nitrogen inside the treating chamber.

Furthermore, the production method may be characterized in that the rapid cooling is effected by allowing the magnet to stand in ambient atmosphere.

In addition, the production method may be characterized in that an Al wire containing 3 mass % to 10 mass % of Mg is used as a vapor deposition material.

Further, the production method may be characterized in that the textural structure of the Al film comprises a main phase containing Al as the major component and Mg, and an Mg concentration phase containing Al and Mg, in which the Mg concentration is higher than the Mg concentration of the main phase.

Moreover, the production method may be characterized in that the main phase is a crystalline phase with an average crystallite size in a range of 100 nm to 2 µm, and the Mg concentration phase is constituted by an aggregate texture comprising amorphous and/or fine crystals having an average crystallite size of 20 nm or smaller.

Furthermore, the production method may be characterized in that the Mg concentration phase is distributed along the thickness direction of the film from the interface with the magnet to the surface of the film.

In addition, the production method may be characterized in that the width of the Mg concentration phase is in a range of 10 nm to 500 nm.

Additionally, the production method may be characterized in that the main phase contains 95 mass % or higher of Al, and the Mg concentration phase contains 10 mass % to 25 mass % of Mg.

Furthermore, the production method may be characterized in that the main phase contains 0.01 mass % to 5 mass % of Mg.

Further, a rare earth metal-based permanent magnet according to the present invention may be characterized in that it has formed on the surface thereof an Al film containing Mg by a vapor deposition, and that the textural structure of the Al film comprises a main phase containing Al as the major component and Mg, and having an average crystallite size in a range of 100 nm to 2 µm, and an Mg concentration phase containing Al and Mg, in which the Mg concentration is higher than the Mg concentration of the main phase, and constituted by an aggregate texture comprising amorphous and/or fine crystals having an average crystallite size of 20 nm or smaller, wherein the Mg concentration phase is distributed along the thickness direction of the film from the interface with the magnet to the surface of the film at a width in a range of 10 nm to 500 nm, the main phase contains 95 mass % or higher of Al, and the Mg concentration phase contains 10 mass % to 25 mass % of Mg.

Effect of the Invention

According to the present invention, there is provided a method for producing a rare earth metal-based permanent magnet having an Al film containing Mg, which exhibits an excellent salt water resistance.

EXPLANATION OF SYMBOLS

Figure 1:
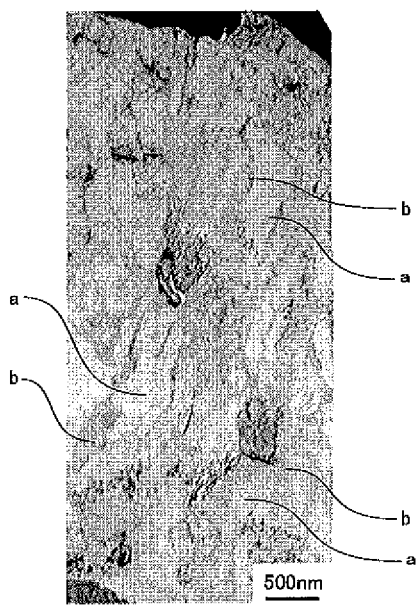
[FIG. 1] It is a transmission electron micrograph showing the textural structure of an Al film containing Mg obtained in Example.

1 Treating chamber
2 Hearth (Melting/evaporating source)
3 Support table
4 Hearth support base
5 Work retaining member
6 Rotary shaft
10 Al containing Mg (Molten vapor deposition material)
11 Al wire containing Mg
20 Feed reel
21 Protective tube
22 Notched window
23 Feeding gear
30 Rare earth metal-based permanent magnet

BEST MODE FOR CARRYING OUT THE INVENTION

The present invention relates to a method for producing a rare earth metal-based permanent magnet having formed on the surface thereof an Al film containing Mg by a vapor deposition, characterized in that the production method comprises, in the case of cooling the magnet from a high temperature of 160° C. or higher after the completion of the vapor deposition step inside the treating chamber of a deposition apparatus, rapidly cooling down the magnet at a cooling rate of 10° C./min or higher until the temperature of the magnet reaches at least 60° C.

As a deposition apparatus usable for carrying out the present invention, there can be mentioned, for example, a deposition apparatus for forming a vapor deposited film on the surface of a magnet as described in JP-A-2001-32062, in which a wire-shaped vapor deposition material is continuously supplied and evaporated to a heated melting/evaporating source. A case of carrying out the present invention by using the deposition apparatus disclosed in JP-A-2001-32062 and an Al wire containing Mg as a vapor deposition material is briefly described below.

Figure 3:
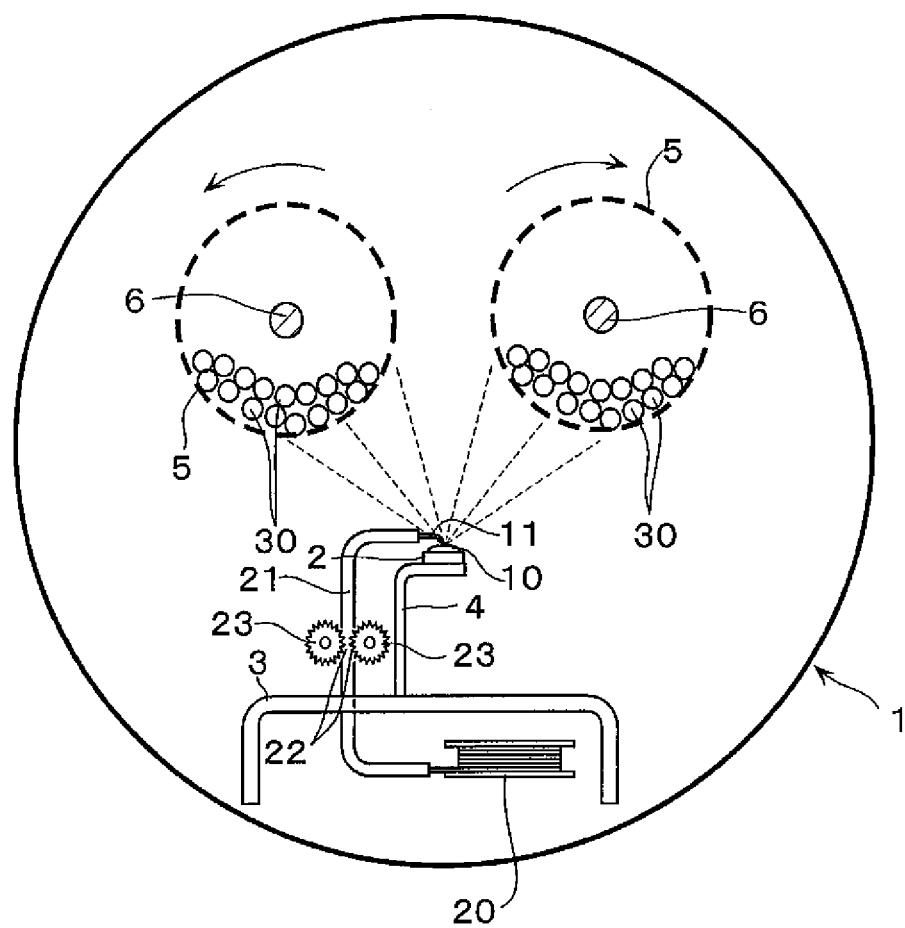
[FIG. 3] It shows a schematic front view of an example of a deposition apparatus usable for carrying out the present invention.

FIG. 3 shows a schematic front view of an example of a deposition apparatus usable for carrying out the present invention, in which at a lower portion of the treating chamber (vacuum chamber) 1 connected to a vacuum evacuating system which is not shown, a plurality of hearths (vessels for melting a vapor deposition material) 2, each of which is a melting/evaporating source for evaporating Al containing Mg 10, are disposed on a hearth support base 4 risen on a support table 3. Further, two cage-shaped work retaining members 5 each formed of a net-shaped material are disposed side-by-side for rotation about rotary shafts 6 at an upper portion of the treating chamber 1. An Al wire containing Mg 11 as a vapor deposition material is wound and retained around a feed reel 20 inside a lower portion of the support table 3. The direction of winding of the Al wire containing Mg 11 around the feed reel 20 is horizontal for the purpose of preventing the twisting or deflection of the wire fed by setting it perpendicular to a direction of feeding of the wire, i.e., a vertical direction. The proceeding end of the Al wire containing Mg 11 is guided to above the hearth 2 by a thermal resistant protective tube 21 facing toward an inner surface of the hearth 2. A notched window 22 is provided in a portion of the protective tube 21, so that the Al wire containing Mg 11 can be fed at a predetermined feed rate into the hearth 2 by a pair of feeding gears 23 mounted in correspondence to the notched window 22. In accordance with the deposition apparatus, a rare earth metal-based permanent magnet 30 is placed into the work retaining member 5, and the Al containing Mg 10 is evaporated by continuously supplying the Al wire containing Mg 11 to the hearth 2 heated to a predetermined temperature by a heating means which is not shown, while rotating the work retaining member 5 as indicated by an arrow, thereby an Al film containing Mg can be formed by a vapor deposition on the surface of the rare earth metal-based permanent magnet 30 inside the work retaining member 5.

The amount of Mg contained in the Al wire is preferably in a range of 3 mass % to 10 mass %. If the concentration should be lower than 3 mass %, the amount of Mg contained in the Al film formed by a vapor deposition on the surface of the rare earth metal-based permanent magnet becomes low, thereby making it difficult to form the Mg concentration phase which contributes to the improvement of the salt water resistance of the Al film, therefore, it is likely that imparting an excellent salt water resistance to the Al film cannot be done. On the other hand, if the concentration exceeds 10 mass %, the hardness of the wire increases as to impair the operability in feeding the wire into the melting/evaporating source, or the vapor deposition material not yet molten inside the melting/evaporating source may possibly induce splashes. Furthermore, if oxygen should be present inside the treating chamber, special notice should be made because Mg undergoes oxidation at the stage the vapor deposition material is molten or evaporated as to decrease the amount of Mg contained in the Al film as compared to the amount of Mg contained in the vapor deposition material.

In view of the above points, the Al wire containing Mg is preferably such containing hydrogen. Since hydrogen can be supplied inside the treating chamber when the vapor deposition material is evaporated, a reducing atmosphere can be provided inside the treating chamber without externally supplying hydrogen by using a separate means; for instance, even under an atmosphere with an oxygen partial pressure of $10^{-3}$ Pa or higher, the oxidation of the molten or evaporated vapor deposition material can be prevented from occurring. The hydrogen content of the Al wire containing Mg is preferably in a range of 1 ppm to 20 ppm, and more preferably, 2 ppm to 10 ppm. If the content should be lower than 1 ppm, sufficient hydrogen might not be supplied into the treating chamber. On the other hands if the content exceeds 20 ppm, hydrogen might boil to cause splashes inside the melting/evaporating source.

The heating temperature of the melting/evaporating source is preferably in the range of 1300° C. to 1500° C. If the temperature should be lower than 1300° C., the vapor deposition material might not be molten efficiently. If the vapor deposition material cannot be molten efficiently, the difference between the vapor pressure of Al and the vapor pressure of Mg (the vapor pressure of Mg is higher) greatly influences the metallic composition of the vapor-deposited Al film so as to induce such a phenomenon in which the Mg content of the Al film is considerably differed from the Mg content of the Al wire, thereby it is likely that an Al film with an intended metallic composition cannot be formed by the vapor deposition. On the other hand, if the temperature exceeds 1500° C., the peripheral temperature becomes too high as to soften the wire; this might hinder the smooth continuous supply of the wire to the melting/evaporating source by causing clogging it and the like inside the protective tube 21 shown in FIG. 1.

The feed rate of the Al wire containing Mg to the melting/evaporating source is preferably in a range of 1 g/min to 10 g/min, and more preferably, 2 g/min to 5 g/min. If the feed rate should be lower than 1 g/min, the vapor deposition material might not be molten efficiently. On the other hand, if the feed rate exceeds 10 g/min, the vapor deposition material not yet molten inside the melting/evaporating source may possibly induce splashes.

The heating temperature of the melting/evaporating source and the feed rate of the Al wire containing Mg to the melting/evaporating source are preferably set as such that the temperature of the rare earth metal-based permanent magnet at the vapor deposition step should not exceed 255° C. If the temperature should exceed 255° C., the Al film formed on the surface of the magnet may soften as to easily cause film defects.

In the case an Al film containing Mg (preferably, the Mg content of the Al film is in a range of 3 mass % to 20 mass %) is formed by vapor deposition at a desired film thickness (for instance, 0.1 μm to 50 μm) on the surface of the rare earth metal-based permanent magnet under such conditions as stated above, the temperature of the magnet reaches as high as 160° C. or higher, typically 180° C. or higher, in the treating chamber. In the present invention, in the case of cooling the magnet at such a high temperature after the completion of the vapor deposition step inside the treating chamber, it is rapidly cooled down at a cooling rate of 10° C./min or higher until the temperature of the magnet reaches at least 60° C. By carrying out this process, the Al film containing Mg formed on the surface of the magnet exhibits an excellent salt water resistance. The rapid cooling operation is effected, for instance, by introducing gaseous nitrogen inside the treating chamber (preferably at 15° C. or lower), or by allowing the magnet to stand in ambient atmosphere (preferably at 25° C. or lower). These operations may be combined. Furthermore, the rapid cooling operation may be carried out at a constant cooling rate from the beginning to the completion of the operation. Otherwise, the cooling rate may be gradually increased or decreased, or multiple cooling rates may be employed to carry out the process in multiple steps. In such cases, the "cooling rate of 10° C./min or higher" as referred in the present invention means an average cooling rate from the beginning to the completion of the operation. Moreover, the upper limit of the cooling rate is preferably 100° C./min, and more preferably, 50° C./min. If the cooling rate exceeds 100° C./min, unfavorable influences might be exerted to the adhesiveness of the Al film formed on the surface of the magnet.

In the case of cooling the magnet from a high temperature of 160° C. or higher after the completion of the vapor deposition step inside the treating chamber, by rapidly cooling down the magnet at a cooling rate of 10° C./min or higher until the temperature of the magnet reaches at least 60° C., the Al film containing Mg develops a textural structure comprising a main phase containing Al as the major component and Mg, and an Mg concentration phase containing Al and Mg, in which the Mg concentration is higher (for instance, three times or higher) than the Mg concentration of the main phase; more specifically, a textural structure comprising a main phase containing Al as the major component and comprising a crystalline phase with an average crystallite size in a range of 100 nm to 2 μm, and an Mg concentration phase containing condensed Mg, constituted by an aggregate texture comprising amorphous and/or fine crystals having an average crystallite size of 20 nm or smaller, wherein the Mg concentration phase is distributed continuously or intermittently along the thickness direction of the film from the interface with the magnet to the surface of the film at a width in a range of 10 nm to 500 nm, the main phase contains 95 mass % or higher of Al (0.01 mass % to 5 mass % of Mg is present as solid solution), and the Mg concentration phase contains 10 mass % to 25 mass % of Mg. As is described in detail in the Example hereinafter, the unique textural structure of the Al film containing Mg is considered to participate in that the Al film containing Mg formed on the surface of the magnet exhibits an excellent salt water resistance by rapidly cooling down the magnet after the completion of the vapor deposition step.

EXAMPLES

The present invention is explained in further detail below by way of examples, however, it should not be understood that the present invention is limited thereto. In the Example and the Comparative Example below, a sintered magnet of 42 mm×20 mm×2 mm in size and having a composition of 17 Nd-1 Pr-75 Fe-7 B (at %) (which is referred to hereinafter as "magnet test piece") is used, which was prepared according to a process described in, for example, U.S. Pat. Nos. 4,770,723 and 4,792,368; i.e., by pulverizing a known cast ingot and then subjecting the resulting powder to a pressing, a sintering, a heat treatment and a surface working. The deposition apparatus used herein was such shown in FIG. 3, having two cylindrical barrels, each of which is of 355 mm in diameter and 1200 mm in length, made of a stainless steel mesh net and disposed inside the vacuum chamber in parallel with each other on the left and right, in which the vapor deposition treatment can be carried out by continuously supplying a wire-shaped vapor deposition material to the melting/evaporating source, while rotating the cylindrical barrels.

Example

A magnet test piece was subjected to sand blasting to remove the oxidized layer formed on the surface of the test piece during the surface working in the prior steps. In to each of the cylindrical barrels were placed 1.5 kg each of the oxidized layer removed magnet test pieces, and after evacuating the inside of the vacuum chamber to $1 \times 10^{-1}$ Pa, gaseous Ar was supplied so that the total pressure inside the vacuum chamber may become 1.0 Pa. Then, the cleaning of the surface of the magnet test pieces was carried out by applying glow discharge for 15 minutes under a bias voltage of 0.5 kV, while rotating the rotary shaft of the barrel at 6.0 rpm.

Subsequently, under an Ar gas pressure of 1.0 Pa and a bias voltage of 1.0 kV, an Al wire containing 5 mass % of Mg and having a hydrogen content of 5 ppm (according to JIS A5356 standard) was continuously supplied as a vapor deposition material at a feed rate of the wire of 3.9 g/min, and heated to evaporate (hearth temperature: 1400° C.), thus, a vapor deposition was conducted for 30 minutes to form an Al film containing Mg on the surface of the magnet test piece. The temperature of the magnet test piece reached to 200° C. at the completion of the vapor deposition step, but was not as high as 255° C. (For confirmation, "thermo crayon", manufactured by Nichiyu Giken Kogyo Co., Ltd., for 255° C. and that for 200° C. were each shaved and wrapped inside an Al foil, and were wound around one of the magnet test pieces. Only the "thermo crayon" for 200° C. was found to be molten). Upon completion of the vapor deposition step, gaseous nitrogen of 15° C. was immediately introduced inside the treating chamber to rapidly cool the magnet test pieces, and the inside of the treating chamber was opened to the atmosphere to take out the magnet test pieces, which were laid on an Al plate in the atmosphere (at a temperature of 25° C. or lower) in such a manner that they would not be superposed with each other to cool them. The temperature of the magnet test piece was found to be 43° C. as measured by means of a radiation thermometer. The time elapsed before measuring the temperature of the magnet test piece after introducing gaseous nitrogen inside the treating chamber was 8 minutes. Accordingly, the cooling rate of the magnet test piece was 19.6° C./min or higher, because the magnet test piece heated to a temperature of at least 200° C. was cooled to 43° C. in 8 minutes (if the temperature of the magnet test piece had reached to the vicinity of 255° C., the maximum cooling rate was 26.5° C./min).

Thus obtained magnet test piece having an Al film containing Mg on the surface thereof was placed inside a blast processing apparatus, and the Al film containing Mg was subjected to a shot peening treatment by injecting spherical glass beads powder having an average particle diameter of 120 μm and a Mohs hardness of 6 as a blasting material together with a pressurizing gas consisting of gaseous nitrogen at an injection pressure of 0.15 MPa for 5 minutes. The film thickness of the Al film containing Mg subjected to a shot peening was found to be 11.5 μm as measured by means of a fluorescent X-ray film thickness gauge (SFT-7000, Seiko Instruments Inc.). Furthermore, the composition of the Al film formed by a vapor deposition on the surface of a glass sheet (35 mm×10 mm×1 mm), which has been placed inside the cylindrical barrel together with the magnet test piece was measured with an inductively coupled plasma—atomic emission spectrometer (ICP-ABS; ICPS-7500, manufactured by Shimadzu Corporation), and the Al film was found to contain 5.9 mass % of Mg. The magnet test piece having an Al film containing Mg on the surface thereof, to which a shot peening was effected, was subjected to a salt water spray test under conditions of 35° C.-5% NaCl-pH 7.0 (according to JIS Z2371 standard) to observe the generation of rust. As a result, no rust generation was observed even after passage of 500 hours from the beginning of the test, and degradation of magnetic characteristics, which is of practical problem, was not recognized.

Figure 2:
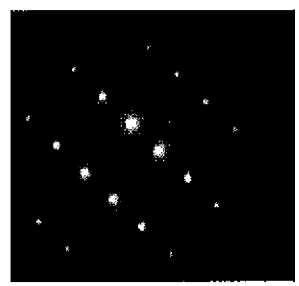
[FIG. 2] It is an electron diffraction image of the same specimen as above.
Figure 2:
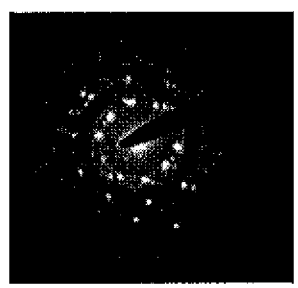

The textural structure of the Al film containing Mg subjected to a shot peening was observed with a transmission electron microscope (HF2100, manufactured by Hitachi, Ltd.). In FIG. 1 is shown the micrograph. FIG. 2 further shows the electron diffraction images of the light colored part "a" and the dark colored part "b" in FIG. 1. Furthermore, the composition of the film was measured with an energy dispersive X-ray spectrometer (EDX, manufactured by Thermo NORAN), and the results are given in Table 1. In view of FIGS. 1 and 2, together with Table 1, the textural structure of the Al film containing Mg was found to comprise a main phase (the part shown by "a" in the figure) which is a crystalline phase with an average crystallite size of 800 nm and containing Al as the major component, and an Mg concentration phase (the part shown by "b" in the figure) containing condensed Mg, constituted by an aggregate texture comprising amorphous and/or fine crystals having an average crystallite size of 20 nm or smaller, wherein the Mg concentration phase is distributed continuously or intermittently along the thickness direction of the film from the interface with the magnet to the surface of the film at a width in a range of 10 nm to 500 nm. Furthermore, it has been found that the main phase contains 96.1 mass % of Al (2.5 mass % of Mg is present as solid solution), and the Mg concentration phase contains 21.6 mass % of Mg, having a mixed phase texture comprising a fine crystalline phase or amorphous phase containing Al as the major component with 0.01 mass % to mass % of Mg present as solid solution and a fine crystalline phase which is thought to consist of $Al_3Mg_2$. No report on an Al film containing Mg having such a textural structure has been made so far, so this film was found to be a novel film.

TABLE 1

|  | Al | Mg | O |
|---|---|---|---|
| Main phase | 96.1 | 2.5 | 1.4 |
| Mg concentration phase | 76.5 | 21.6 | 1.9 | unit: mass %

(Discussion)

The unique textural structure of the Al film containing Mg described above is considered to participate in that the Al film containing Mg formed on the surface of the magnet exhibits an excellent salt water resistance by rapidly cooling down the magnet after the completion of the vapor deposition step. In general, the cooling step of the magnet after the completion of the vapor deposition step is effected by gradually cooling (slow cooling) over a long time inside the treating chamber, and the inside of the treating chamber is opened to the atmosphere after the temperature of the magnet is lowered to some extent. However, if such a cooling step should be employed, the film does not develop such a unique textural structure as above, and in a salt water spray test under conditions of 35° C.-5% NaCl-pH 7.0 (according to JIS Z2371 standard), rust generation is observed after passage of 500 hours (as a matter of course, this film is also superior in a salt water resistance because no rust generation is observed after passage of 300 hours).

It is thought to be proper that the relation of the difference in the textural structure of the film and the difference in a salt water resistance is considered as follows. That is, in the Al film containing Mg, the unique textural structure as above originally develops from the beginning to the end of the vapor deposition step by the diffusion of Mg into the film at a high temperature. Then, the textural structure is retained without changing by rapidly cooling down the magnet after the completion of the vapor deposition step, thereby exhibiting an excellent salt water resistance by the presence of the Mg concentration phase. Since $Al_3Mg_2$, which is thought to constitute the Mg concentration phase, has lower potential than Al, it is deduced that it decomposes when brought into contact with salt water as to generate MgO or $Mg(OH)_2$. Since MgO or $Mg(OH)_2$ is relatively superior in a salt water resistance, they function as a barrier layer against salt water in the film to effectively prevent the corrosion due to salt water from occurring on the magnet. Because the Mg concentration phase is distributed continuously or intermittently along the thickness direction of the film from the interface with the magnet to the surface of the film, if the barrier layer against salt water should be destroyed at some part, MgO and $Mg(OH)_2$ sequentially generates from $Al_3Mg_2$ that is thought to be present in the Mg concentration phase as to reform the barrier layer. As a result, the excellent salt water resistance is exhibited. On performing composition analysis on the surface of the film subjected to a salt water spray test by using a Marcus type glow discharge optical emission spectrometer (manufactured by Horiba, Ltd.), elements of Al, Mg, O, and H are observed, and the proportion of Mg concentration with respect to Al concentration was found to be higher for the surface of the film as compared to the inside of the film. This fact supports the above idea that MgO and Mg $(OH)_2$ function as a barrier layer against salt water in the film. On the contrary, if the magnet is slowly cooled down after the completion of the vapor deposition step, the unique textural structure as above once formed at a high temperature changes, because the distribution of the Mg concentration phase in the film may become heterogeneous, the Mg content of the Mg concentration phase may decrease, or the fine structure may be lost. Thus, the salt water resistance is impaired as a result.

In the case of thus explaining the reason why the Al film containing Mg formed on the surface of the magnet exhibits an excellent salt water resistance by rapidly cooling down the magnet after the completion of the vapor deposition step, it can be understood that, in order to obtain a further stable film with a unique textural structure as above by the diffusion of Mg more homogeneously into over the entire film, the film is preferably set under a high temperature for a longer time, for instance, the magnet is preferably retained at 160° C. or higher for at least 5 minutes prior to the cooling operation. By setting the film under a high temperature for a longer time, there is also an effect that the textural structure of the film can be always constant. In the above example, the temperature of the magnet test piece at the completion of the vapor deposition step was confirmed by preliminary experiment to reach 160° C. by effecting 25 minutes of the vapor deposition (For confirmation, "thermo crayon", manufactured by Nichiyu Giken Kogyo Co., Ltd., for 160° C. was shaved and wrapped inside an Al foil, and was wound around one of the magnet test pieces, which was found to be molten); thus, the magnet test piece was retained at 160° C. or higher for at least 5 minutes. Furthermore, in the above example, the film was formed by a vacuum deposition method in which the vapor deposition material is simply heated to evaporate and to form the film, however, the formation of a film may be carried out by an ion plating method in which the evaporated vapor deposition material is ionized to form the film, or by a sputtering method or an EB method. Depending on the method for forming the film, the film may be formed without heating the magnet to a high temperature under the general process conditions, or the film may be formed in a short period of time, such that the temperature of the magnet at the completion of the vapor deposition step may not reach 160° C., however, in such cases, the magnet may be heated to 160° C. or higher after the completion of the vapor deposition step. The upper limit of the heating temperature is preferably set to 300° C. from the viewpoint of preventing the generation of film damages or extrusions due to the softening of the film.

INDUSTRIAL APPLICABILITY

The present invention has an industrial applicability in the point that it can provide a method for producing a rare earth metal-based permanent magnet having an Al film containing Mg, which exhibits an excellent salt water resistance.

The invention claimed is:
1. A method for producing a rare earth metal-based permanent magnet having formed on a surface thereof an Al film containing Mg by a vapor deposition, characterized in that the production method comprises:
    cooling the rare earth metal-based permanent magnet from a high temperature of 160° C. or higher at a cooling rate of 10° C./min or higher until the temperature of the magnet reaches 60° C. or lower after a completion of a vapor deposition of an Al film containing Mg inside a treating chamber of a deposition apparatus, wherein a textural structure of the Al film containing Mg comprises a main phase containing Al as the major component and Mg, and an Mg concentration phase containing Al and Mg, in which the Mg concentration is higher than the Mg concentration of the main phase, wherein the main phase is a crystalline phase with an average crystallite size in a range of 100 nm to 2 μm, and the Mg concentration phase is constituted by an aggregate texture comprising amorphous and/or fine crystals having an average crystallite size of 20 nm or smaller, wherein the Mg concentration phase is distributed along a thickness direction of the film from the interface with the magnet to a surface of the film, wherein a width of the Mg concentration phase is in a range of 10 nm to 500 nm, wherein the main phase contains 95 mass % or higher of Al, and the Mg concentration phase contains 10 mass % to 25 mass % of Mg, wherein the main phase contains 0.01 mass % to 5 mass % of Mg, and wherein a heating temperature of a melting/evaporation source and a feed rate of an Al wire containing Mg to the melting/evaporation source are set such that a temperature of the rare earth metal-based permanent magnet at a vapor deposition step is at most 255° C.

2. The production method as claimed in claim 1, wherein the magnet is held for at least 5 minutes at 160° C. or higher prior to the cooling operation.

3. The production method as claimed in claim 1, wherein the cooling is effected by introducing gaseous nitrogen inside the treating chamber.

4. The production method as claimed in claim 1, wherein the cooling is effected by allowing the magnet to stand in ambient atmosphere.

5. The production method as claimed in claim 1, wherein the vapor deposition comprises using an Al wire containing 3 mass % to 10 mass % of Mg as a vapor deposition material.

* * * * *